United States Patent [19]

Matsuda et al.

[11] Patent Number: 4,569,855

[45] Date of Patent: Feb. 11, 1986

[54] METHOD OF FORMING DEPOSITION FILM

[75] Inventors: Hiroshi Matsuda, Yokohama; Masahiro Haruta, Funabashi; Ken Eguchi, Yokohama; Yukuo Nishimura, Sagamihara; Yutaka Hirai; Takashi Nakagiri, both of Tokyo, all of Japan

[73] Assignee: Canon Kabushiki Kaisha, Tokyo, Japan

[21] Appl. No.: 722,132

[22] Filed: Apr. 11, 1985

[51] Int. Cl.⁴ ............................................. B05D 3/06
[52] U.S. Cl. ...................... 427/35; 423/349; 427/53.1; 427/54.1; 427/86
[58] Field of Search .............. 427/35, 36, 53.1, 54.1, 427/55, 86; 204/157.1 R; 423/348, 349, 350

[56] References Cited

U.S. PATENT DOCUMENTS

| | | | |
|---|---|---|---|
| 3,101,257 | 8/1963 | Hagen et al. | 423/349 |
| 3,661,637 | 5/1972 | Sirtl | 427/53.1 |
| 3,956,193 | 5/1976 | Henney et al. | 423/349 |
| 4,448,801 | 5/1984 | Fukuda et al. | 427/54.1 |
| 4,495,218 | 1/1985 | Azuma et al. | 427/53.1 |

Primary Examiner—John H. Newsome
Attorney, Agent, or Firm—Fitzpatrick, Cella, Harper & Scinto

[57] ABSTRACT

A process for forming a deposition film, wherein a gaseous atmosphere of a silicon compound selected from
 (i) a silicon compound having at least one azo group directly bonded to a silicon atom and
 (ii) a silicon compound having at least one azide group directly bonded to a silicon atom
is formed in a deposition chamber in which a substrate is placed, said compound is excited and decomposed utilizing light energy, and a deposition film containing silicon atoms is formed on said substrate.

A compound containing atoms of a group III element or a group V element of the Periodic Table may be included in the atmosphere in the deposition chamber, the compounds excited and decomposed utilizing light energy, and a deposition film containing silicon atoms and the atoms in the group III or V element of the Periodic Table formed on said substrate.

8 Claims, 2 Drawing Figures

METHOD OF FORMING DEPOSITION FILM

BACKGROUND OF THE INVENTION

1. Field of the Invention

The present invention relates to a method of forming a deposition film such as a photoconductive film, a semiconductor film or an insulating film on a predetermined substrate utilizing light as an excitation energy, more particularly to a method of forming a deposition film wherein a source gas is excited or decomposed by applying excitation energy such as one or both of light and heat so as to form a deposition film containing silicon atoms on a predetermined substrate.

2. Description of the Prior Art

As a conventional amorphous silicon (to be referred to as "a-Si" hereinafter) deposition film formation method, the glow discharge deposition method or thermal energy deposition method utilizing $SiH_4$ or $Si_2H_6$ as a raw material for a source gas is known. In these methods, $SiH_4$ or $Si_2H_6$ as a source gas is decomposed by electrical or thermal energy (excitation energy) so as to form an a-Si deposition film on a substrate. The deposition film formed in this manner is used for various purposes such as a photoconductive film, a semiconductor film or an insulating film.

However, in the glow discharge deposition method wherein a deposition film is formed with a high-output discharge, a uniform discharge distribution cannot always be obtained and stable condition control with good reproducibility is difficult to attain. In addition, the adverse influence of high-output discharge on the film being formed is considerable. Thus, it is difficult to impact uniform electrical and optical characteristics and stable quality to the formed film. The formed film therefore tends to have an irregular surface or microdefects therein. It is particularly difficult to form a deposition film having a large area or thickness and uniform electrical and optical characteristics.

In the thermal energy deposition method, the raw material is normally subjected to a high temperature of 400° C. or higher. For this reason, the substrate material which can be used is limited. In addition, the probability that effective bonded hydrogen atoms in desired a-Si are dissociated is increased, again resulting in poor characteristics of the film.

As a method free from the problems with these methods, the photo-energy deposition method (to be referred to as the "photo-CVD" method hereinafter) of depositing a-Si using $SiH_4$ or $Si_2H_6$ as a raw material is receiving a lot of attention recently.

The photo-CVD method uses light in place of the glow discharge or heat as the excitation energy unlike in the above methods. For this reason, an a-Si deposition film can be formed at a low energy level and it is easy that a source gas can be uniformly irradiated with light energy. As compared to the above-mentioned deposition method, a high- and uniform-quality film can be formed with a lower energy consumption than with the above methods. Control of film formation conditions is also easy to achieve stable reproducibility. In addition, a substrate need not be heated to a high temperature and a substrate material can be selected from a wider range of materials.

However, this photo-CVD method using $SiH_4$ or $Si_2H_6$ as a raw material has only a limited decomposition efficiency of the source gas and hence a limited deposition rate, thus disabling mass-production.

SUMMARY OF THE INVENTION

The present invention has been made in consideration of the above-mentioned problems and has as its object to provide a photo-CVD method which uses light as excitation energy and which can form a deposition film containing silicon atoms at a high deposition rate and a low energy level, while maintaining a high-quality deposition film.

It is another object of the present invention to provide a method of forming a deposition film which allows formation of a high-quality deposition film having uniform electrical and optical characteristics and stable quality even if the film to be formed has a large area or thickness.

According to one aspect of the present invention, there is provided a process for forming a deposition film, wherein a gaseous atmosphere of a silicon compound selected from
  (i) a silicon compound having at least one azo group directly bonded to a silicon atom and
  (ii) a silicon compound having at least one azide group directly bonded to a silicon atom
is formed in a deposition chamber in which a substrate is placed, said compound is excited and decomposed utilizing light energy, and a deposition film containing silicon atoms is formed on said substrate.

According to another aspect of the present invention, there is provided a process for forming a deposition film, wherein a gaseous atmosphere of a silicon compound selected from
  (i) a silicon compound having at least one azo group directly bonded to a silicon atom and
  (ii) a silicon compound having at least one azide group directly bonded to a silicon atom,
and a compound containing atoms in a group III element or a group V element of the Periodic Table is formed in a deposition chamber in which a substrate is placed, the compounds are excited and decomposed utilizing light energy, and a deposition film containing silicon atoms and the atoms in the group III or V element of the Periodic Table is formed on said substrate.

DETAILED DESCRIPTION OF THE PREFERRED EMBODIMENTS

Figure 1:
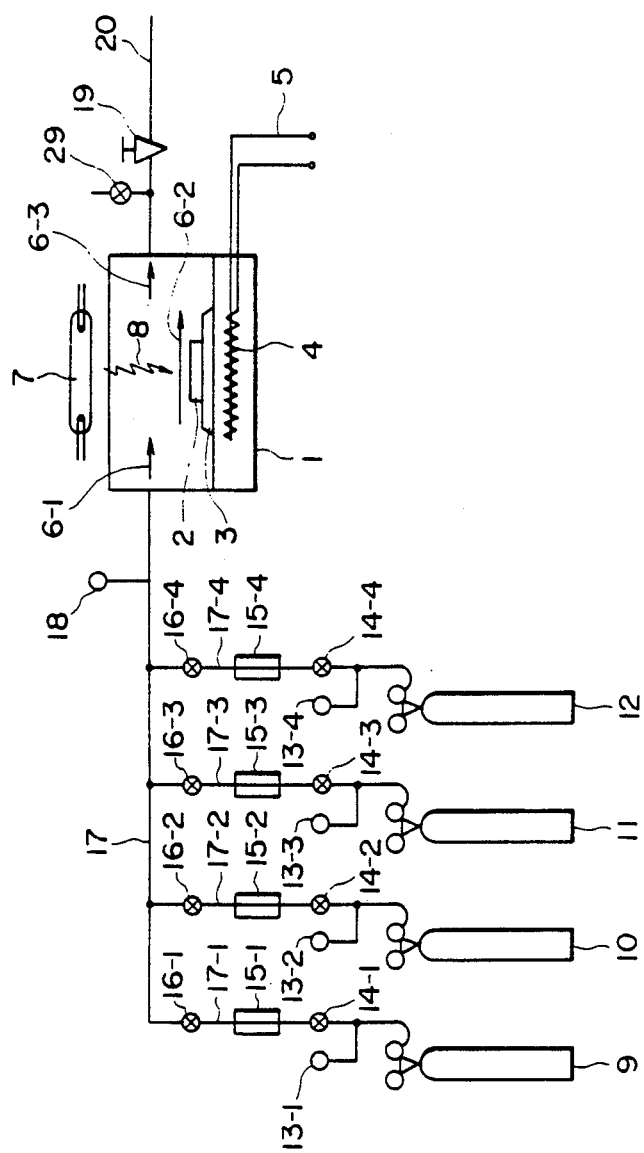
FIG. 1 is a view showing the construction of an example of a deposition film formation apparatus used in a method according to the present invention.

An Si-source raw material for forming a deposition film to be used in the method of the present invention is a silicon compound having at least one azo or azide group which is directly bonded to a silicon atom. This compound can be easily excited and decomposed by light energy. Examples of such silicon compounds are exemplified below.

Examples of silicon compounds having at least one azo group directly bonded to a silicon atom may include:

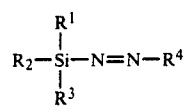 (a)

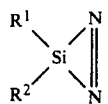 (b)

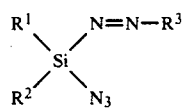 (c)

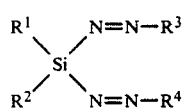 (d)

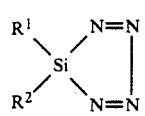 (e)

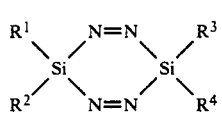 (f)

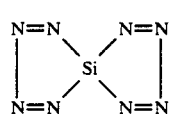 (g)

wherein $R^1$, $R^2$, $R^3$, and $R^4$ are independently a hydrogen atom, a halogen, an aryl group, an alkyl group having 1 to 4 carbon atoms or an alkoxyl group having 1 to 4 carbon atoms and can be the same or different (all of $R^1$ to $R^4$ can be methyl group), the alkyl group, the aryl group or the alkoxyl group being replaceable with another substituent, and $R^1$ to $R^4$ being preferably a hydrogen atom, an alkyl group having 1 to 4 carbons, F, Cl or Br.

The compounds (b), (e), and (f) are preferred.

Examples of silicon compounds having at least one azide group directly bonded to a silicon atom may include:

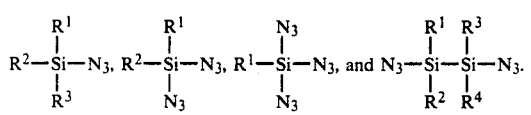

wherein $R^1$, $R^2$, $R^3$, and $R^4$ are independently a hydrogen atom, a halogen, an aryl group, an alkyl group or an alkoxyl group which have 1 to 4 carbons and can be the same or different (all of $R^1$ to $R^4$ can be methyl groups), the aryl group, the alkyl group or the alkoxyl group being replaceable with another substituting group, and $R^1$ to $R^4$ being preferably a hydrogen atom, an alkyl group having 1 to 4 carbons, F, Cl or Br.

Preferred examples of these compounds may include compounds having the following formulas:

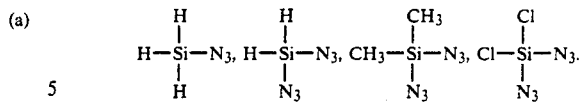

Light energy referred to herein means an energy means which can provide sufficient excitation energy when it is irradiated onto the source gas selected from those enumerated above. An energy beam of any wavelength can be used if it can excite and decompose a selected source gas and deposit the decomposition product. Examples of such light energy may include ultraviolet rays, infrared rays, visible light rays, X-rays, γ-rays, and the like. A suitable energy beam can be selected in accordance with compatibility with the selected source gas or the like.

According to the method of the present invention, when a compound containing atoms of element in a group III or group V of the Periodic Table is added in addition to the silicon compound described above, a deposition film containing silicon atoms and the atoms of the selected element can be formed. A deposition film obtained with this method can serve for various purposes as a functional film such as a photoconductive film, a semiconductor film or the like.

In order to introduce atoms of a group III element such as B, Al, Ga, In or Tl or atoms of a group V element such as N, P, As, Sb or Bi in a deposition film to be manufactured by the method of the present invention, a raw material can be a compound which contains atoms of such an element and which can be easily excited and decomposed upon irradiation with light energy. Examples of such compounds may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_6H_{10}$, $B_6H_{12}$, $AlCl_3$ or the like.

The method of the present invention will be described in detail with reference to FIG. 1.

FIG. 1 shows the construction of a deposition film formation apparatus for forming an a-Si functional film such as an a-Si photoconductive film, semiconductor film or insulating film on a substrate.

A deposition film is formed within a deposition chamber 1.

A numeral 3 denotes a support placed inside the deposition chamber 1, on which a substrate 2 is set.

A heater 4 for heating the substrate is powered through a wire 5. One end of a gas supply pipe 17 is connected to the deposition chamber 1 so as to supply therein an a-Si film formation source gas, a carrier gas and the like as needed. The other end of the pipe 17 is branched and each branch is connected to gas supply sources 9, 10, 11, and 12 for supplying the source gas and gases such as a carrier gas used as needed. Flow meters 15-1, 15-2, 15-3, and 15-4 are arranged midway along corresponding gas supply pipes 17-1, 17-2, 17-3, and 17-4. Valves 14-1, 14-2, 14-3, and 14-4; and 16-1, 16-2, 16-3, and 16-4 are arranged before and after the respective flow meters. When each valve pair is adjusted, the flow rate of the corresponding gas can be controlled. Pressure meters 13-1, 13-2, 13-3, and 13-4 are for measuring the pressures at the high-pressure sides of the corresponding flow meters.

The gases passing through the respective flow meters are mixed and are supplied into the deposition chamber 1 which is kept at a reduced pressure by an evacuation unit (not shown). A pressure meter 18 measures the total pressure of the gas mixture.

One end of a gas exhaust pipe 20 is connected to the deposition chamber 1 so as to keep the chamber 1 at a reduced pressure or to evacuate the gas supplied into the chamber 1. The other end of the gas exhaust pipe 20 is connected to the evacuation unit (not shown).

A light energy generator 7 is arranged above the chamber 1.

When the deposition chamber 1 does not consist of a transparent material such as quartz, glass, a window for allowing light energy 8 to pass therethrough is formed on at least a portion of the chamber 1 which is on a substrate 2.

According to the present invention, the number of the gas supply sources 9, 10, 11 and 12 can be properly selected.

When only a single source gas is used, only one gas supply source is required. However, when two or more source gases are mixed and used in the form of a gas mixture or when a catalyst gas or a carrier gas is used together with a single source gas, two or more gas supply sources must be used.

Some raw materials are in liquid form instead of in gaseous form at room temperature. When a liquid raw material is used, a gasifying unit (not shown) is included. A gasifying unit can be one which utilizes boiling by heating, one in which a carrier gas is passed through a liquid raw material, or the like. The source gas obtained by gasification is passed through a flow meter and is introduced into the deposition chamber 1.

An a-Si deposition film can be formed by the method of the present invention using the apparatus as shown in FIG. 1 in the following manner:

A substrate 2 is set on a support 3 placed inside a deposition chamber 1.

Various substrates 2 can be used in accordance with intended applications of deposition films to be formed. Examples of the material of a conductive substrate 2 for forming a deposition film may include NiCr, stainless steel, metals such as Al, Cr, Mo, Au, Nb, Ta, V, Ti, Pt, or Pd and alloys thereof. Examples of the material of a semiconductor substrate for forming a deposition film may include semiconductors such as Si, Ge or the like. Examples of the material of an insulating substrate for forming a deposition film may include synthetic resins such as polyester, polyethylene, polycarbonate, cellulose acetate, polypropylene, polyvinyl chloride, polyvinylidene chloride, polystyrene, or polyamide; glass; ceramics; paper; and the like. The shape and size of the substrate 2 are properly selected in accordance with the intended purpose of a deposition film to be formed.

According to the method of the present invention, the temperature of the substrate can be set at a relatively low temperature of about 50° to 150° C. Therefore, low heat-resistant materials for the substrates which are enumerated above but cannot be used in the conventional glow discharge deposition method or thermal energy deposition method can be used.

After the substrate 2 is placed on the support 3 inside the deposition chamber 1, the air inside the deposition chamber 1 is evacuated by the evacuation unit (not shown) through the gas exhaust pipe 20. The reduced pressure inside the deposition chamber is $5 \times 10^{-5}$ Torr or less and is preferably $10^{-6}$ Torr or less.

When the interior of the deposition chamber 1 is reduced in pressure in this manner, the heater 4 is powered to heat the substrate 2 to a predetermined temperature. The temperature of the substrate in this case is preferably 50° to 150° C. and more preferably 50° to 100° C.

In this manner, since the substrate temperature is relatively low in this method, heating at a high temperature is not required as in the glow discharge deposition method or the thermal energy deposition method. For this reason, energy consumption can be reduced.

Then, the source gas is supplied into the deposition chamber 1 upon opening the valves 14-1 and 16-1 of the gas supply source 9 storing the source compound gas for forming an a-Si film. When a gas mixture of two or more gases is used, if the selected gases do not react under normal conditions, they can be premixed in a predetermined mixing ratio and stored in the gas supply source 9.

During this operation, the gas flow rate is adjusted by means of the flow meters 15-1. Normally, the flow rate of the source gas is 10 to 1,000 SCCM, and is preferably 20 to 500 SCCM.

The pressure of the source gas inside the deposition chamber 1 is $10^{-2}$ to 100 Torr and is preferably $10^{-2}$ to 1 Torr.

When the source gas is supplied to the deposition chamber 1 in this manner, the light energy generator 7 is driven to irradiate the source gas with light energy.

The light energy generator 7 can be a mercury lamp, a xenon lamp, a carbon dioxide gas laser, an Ar ion laser, an excimer laser or the like.

An optical system (not shown) is constructed such that light energy generated upon driving the light energy generator 7 irradiates the substrate 2 placed in the deposition chamber 1.

The light energy can uniformly or selectively irradiate the gas flowing in the vicinity of the substrate 2 placed in the deposition chamber 1.

In this manner, light energy is applied to the source gas flowing near the surface of the substrate 2 and the photo-excitation and photo-decomposition of the gas are promoted. The a-Si thus produced is deposited on the substrate. The source gas used in the method of the present invention is easily excited and decomposed by light energy, and a high deposition rate of about 5 to 100 Å/sec is obtained. The decomposition product other than a-Si and any unreacted source gas are exhausted through the gas exhaust pipe 20. Meanwhile, fresh source gas is continuously supplied through the gas supply pipe 17.

According to the method of the present invention, light energy is used as excitation energy. The optical system can be easily controlled such that the light energy can uniformly irradiate a predetermined space occupied by the source gas, i.e., such that non-uniform distribution of the excitation energy may not be caused. The problem of the adverse influence on a deposition film being formed by light energy due to high-output discharge as encountered in the glow discharge deposition method is not presented. Thus, the formation of a uniform deposition film can be carried out without causing unevenness of the film surface or forming microdefects in the deposition film. Since the light energy can be irradiated within a wide area, a deposition film of large area can be formed uniformly with precision.

When the irradiating portion of light energy is selectively controlled, the portion of the substrate on which the deposition film is to be formed can be limited as desired.

Excitation and decomposition of the source gas by light energy is not limited to direct excitation or decomposition of the source gas by light energy but also includes indirect excitation or decomposition by light energy wherein light energy is absorbed in a source gas or a substrate and is converted into thermal energy and the source gas is excited or decomposed by the thermal energy.

When the a-Si film is formed on the substrate 2 to a desired thickness, irradiation of light enregy from the light energy generator 7 is stopped, and the valves 14-1 and 16-1 are closed to stop supplying the source gas. The thickness of the a-Si film is optimally selected in accordance with the application of the a-Si film obtained and other conditions.

The evacuation unit (not shown) is driven to evacuate the gas inside the deposition chamber 1 and the heater 4 is turned off. When the substrate and the deposition film reach room temperature, a valve 29 is opened to gradually introduce the air into the interior of the chamber 1 and to return the interior of the chamber 1 to normal pressure. Thereafter, the substrate on which the a-Si film is formed is taken out of the chamber 1.

Figure 2:
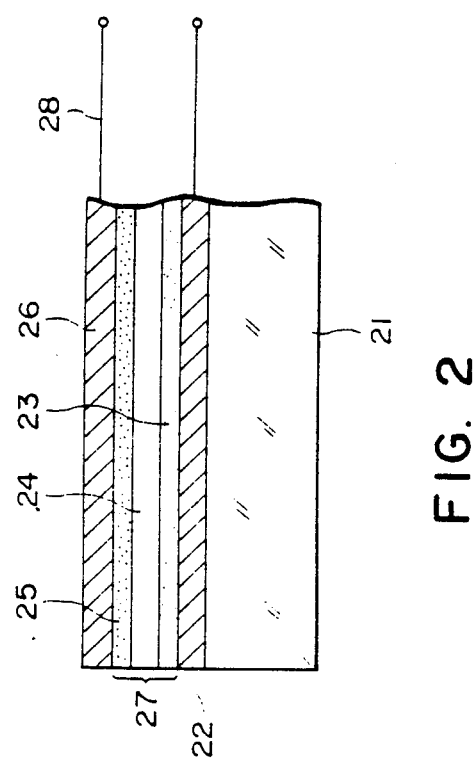
FIG. 2 is a sectional view of a p-i-n diode device which can be formed by the method of the present invention.

FIG. 2 is a sectional view showing the configuration of a typical p-i-n type diode device manufactured by the method of the present invention.

The device comprises a substrate 21, thin film electrodes 22 and 26, a p-type a-Si layer 23, an i-type a-Si layer 24, an n-type a-Si layer 25, a semiconductor layer 27 (comprising the layers 23, 24, and 25), and lead wires 28 for connection with an external electrical circuit.

The thin film electrode 22 is formed on the substrate by vacuum deposition, electron beam deposition, or sputtering of NiCr, Al, Cr, Mo, Au, Ir, Nb, Ta, V, Ti, Pt, Pd, $In_2O_3$, $SnO_2$, ITO, ($In_2O_3+SnO_2$) or the like.

The electrode 22 has a thickness of 30 to $5 \times 10^4$ Å and preferably 100 to $5 \times 10^3$ Å.

In order to form the respective n- or p-type a-Si layers constituting the semiconductor layer 27, a film to be formed is doped with an n- or p-type impurity, while controlling its dosage.

A p-type impurity for doping of the semiconductor layer is a group III element of the Periodic Table and is preferably B, Al, Ga, In or Tl. An n-type impurity for doping of semiconductor layer is a group V element, is preferably N, P, As, Sb or Bi, and is particularly preferably B, Ga, P or Sb.

In order to impart a desired conductivity type to a desired layer of the layer 27, the dose of the impurity to dope the semiconductor layer 27 is determined in accordance with desired electrical and optical characteristics of the device. However, in the case of a group III element, the dose falls within the range of $3 \times 10^{-2}$ to 4 atomic %. In the case of a group V element, the dose falls within the range of $5 \times 10^{-3}$ to 2 atomic %.

When a predetermined layer constituting the semiconductor layer 27 is doped with an impurity selected from those enumerated above, a source gas for introducing an impurity is introduced in the chamber during formation of the corresponding layer. The source gas for introducing an impurity is gaseous at normal temperature and pressure or at least under film formation conditions, or can be easily gasified by a gasigying unit.

Examples of the source gas (impurity gas) for introducing an n-type impurity may include $PH_3$, $P_2H_4$, $PF_3$, $PF_5$, $PCl_3$, $AsH_3$, $AsF_3$, $AsF_5$, $AsCl_3$, $SbH_3$, $SbF_5$ or $BiH_3$. Examples of the source gas for introducing a p-type impurity may include $BF_3$, $BCl_3$, $BBr_3$, $B_2H_6$, $B_4H_{10}$, $B_5H_9$, $B_6H_{10}$, $B_6H_{12}$ or $AlCl_3$.

The method of forming the semiconductor layer 27 will be described in more detail.

The substrate 21 with the thin film electrode 22 formed on its surface is placed on the support 3 inside the deposition chamber 1. The air inside the deposition chamber 1 is exhausted by the evacuation unit (not shown) through the gas exhaust pipe 20. The interior of the deposition chamber is reduced to $5 \times 10^{-5}$ Torr or less and is preferably $10^{-6}$ Torr or less.

When the deposition chamber 1 is reduced in pressure, the heater 4 is turned on so as to heat the substrate 21 supported on the support 3.

In order to deposit a p-type a-Si film on the thin film electrode 22 on the substrate 21, a gas mixture of an Si source gas and a p-type impurity gas mixed in a predetermined mixing ratio is introduced in the chamber 1. The flow rate of the p-type impurity gas is determined from the (flow rate of source gas) × impurity concentration.

Since only a small amount of p- or n-type impurity is mixed, easy flow control can be achieved if the impurity gas is diluted to a predetermined concentration with $H_2$ gas or the like and is used as needed.

The introduced source gases are irradiated with light energy so as to deposit the p-type a-Si film 23 on the substrate 21.

Similarly, the Si source gas is introduced to form an undoped or i-type a-Si film 24. Finally, the Si source gas and the n-type impurity gas are introduced into the chamber 1 to form the n-type a-Si film 25.

The thin film electrode 26 is formed to the same thickness as the electrode layer 22 and by the same method, thereby completing a p-i-n type diode device.

The p-type a-Si film has a thickness of 100 tp $10^4$ Å and preferably 300 to 2,000 Å.

The i-type a-Si film has a thickness of 500 to $5 \times 10^4$ Å and preferably 1,000 to 10,000 Å.

The n-type a-Si film has a thickness of 100 to $10^4$ Å and preferably 300 to 2,000 Å.

A deposition film can be formed not only under a reduced pressure but also under a normal or high pressure according to the method of the present invention.

The present invention will now be described by way of its examples.

EXAMPLE 1

An i-type a-Si (amorphous-Si) layer was formed using the apparatus shown in FIG. 1 and a silicon compound No. 1 shown in Table 1 as a starting material for forming a deposition layer.

First, a substrate [Trade name: "Corning #7059"; transparent conductive film (polyester-based); Corning Inc.]was set on the support 3 inside the deposition chamber 1. The interior of the chamber 1 was evacuated to a pressure of $10^{-6}$ Torr through the gas exhaust pipe 20 by the evacuation unit (not shown). The heater 4 was turned on to keep the support 3 at 60° C. The valves 14-1 and 16-1 of the gas supply source 9 filled with the silicon compound No. 1 were opened to introduce the source gas into the chamber 1.

The gas flow rate was controlled at 150 SCCM while monitoring it by means of the corresponding flow meter 15-1. Then, the pressure inside the deposition chamber was set at 0.1 Torr, and xenon light of intensity 130 mW/cm² was generated from the light energy generator 7 and was irradiated vertically onto the substrate.

An i-type Si layer having a thickness of 1,000 Å was deposited on the substrate 2 at a film forming rate of 20 Å/sec. The light energy was uniformly irradiated onto the gas flowing near the substrate 2 placed in the deposition chamber 1. At this time, the decomposition product other than a-Si and residual unreacted source gas were evacuated through the gas exhaust pipe 20. At the same time, fresh source gas was continuously supplied through the gas supply pipe 17.

The a-Si layer formed by the method of the present invention in this manner was evaluated by the following method. Comb-shaped Al gap electrodes (gap length: 250μ; width: 5 mm) were formed on respective a-Si layers formed in the manner described above. Photocurrents (light intensity AMI: about 100 mW/cm$^2$) and dark currents were measured. Ratios ($\sigma P/\sigma d$) of photoconductivity $\sigma p$ to dark conductivity $\sigma d$ were calculated.

Each gap electrode was formed by the following manner. After an a-Si layer formed by the above method was placed in a deposition chamber, the chamber was reduced in pressure to a vacuum pressure of $10^{-6}$ Torr and then was adjusted to a vacuum pressure of $10^{-5}$ Torr. Al was deposited on the a-Si layer to a thickness of 1,500 Å at a film forming rate of 20 Å/sec. The Al film thus formed was etched using a predetermined pattern mask.

The obtained values of the conductivity $\sigma p$ and the ratio $\sigma p/\sigma d$ are shown in Table 2.

EXAMPLES 2-7

I-type a-Si layers were formed each using one of silicon compounds Nos. 2 to 7 (Examples 2 to 7) in Table 1 as the starting materials for forming deposition layers following the same procedures as in Example 1. The obtained a-Si layers were evaluated by the same method as in Example 1. The obtained evaluation results are shown in Table 2.

EXAMPLES 8-14

I-type a-Si layers were formed each using one of silicon compounds Nos. 1 to 7 (Examples 8 to 14) in Table 1 as the starting materials for forming deposition layers following the same procedures as in Example 1 exept that the substrate temperature was set as shown in Table 3 and light of intensity 150 mW/cm$^2$ from a high-pressure mercury lamp was vertically irradiated onto the substrates. The obtained a-Si layers were evaluated by the same method as in Example 1. The obtained evaluation results are shown in Table 3.

COMPARATIVE EXAMPLE 1

An i-type a-Si layer was formed following the same procedures as in Example 7 except that Si$_3$H$_6$ was used as a starting materials for forming a deposition layer. The obtained a-Si layer was evaluated by the same method as in Example 1. The obtained evaluation results are shown in Table 2.

COMPARATIVE EXAMPLE 2

An i-type a-Si layer was formed following the same procedures as in Example 8 except that Si$_3$H$_6$ was used as a starting material for forming a deposition layer and the substrate temperature was set at 110° C. The obtained a-Si layer was evaluated by the same method as in Example 1. The obtained evaluation results are shown in Table 3.

As can be seen from the evaluation results shown in Tables 2 and 3, in any one of Examples of the present invention, an a-Si layer was obtained having better values of the conductivity $\sigma p$ and ratio $\sigma p/\sigma d$ than those of a layer formed by the conventional photo-CVD method (Comparative Example; substrate temperature: 100° C.) using Si$_3$H$_6$ gas as a source gas.

EXAMPLE 15

A p-type a-Si layer doped with p-type impurity atoms was formed using the apparatus shown in FIG. 1, silicon compound No. 1 shown in Table 1 as a source gas for supplying Si and B$_2$H$_6$ as a p-type impurity source gas.

First, a substrate 2 ]"Corning #7059"; a transparent conductive film (polyester-based)] was set on the support 3. The pressure of the interior of the deposition chamber 1 was reduced to $10^{-6}$ Torr through the gas exhaust pipe 20 by the evacuation unit (not shown). The heater 4 was turned on to keep the substrate temperature at 60° C. The valves 14-1 and 16-1 of the gas supply source 9 filled with silicon compound No. 1 and the valves 14-2 and 16-2 of the gas supply source 10 filled with dilute p-type impurity introducing gas B$_2$H$_6$ diluted to a dilution degree of 0.025 mole % by H$_2$ were opened, thereby introducing the gas mixture into the deposition chamber 1.

By monitoring the flow rates of the respective gases by the flow meters 15-1 and 15-2, the mixing ratio of the gas of silicon compound No. 1 and B$_2$H$_6$ was set to be B/Si=$5\times10^{-3}$ mol/mol and the flow rate of the gas mixture was set at 150 SCCM. The pressure inside the chamber was set at 0.1 Torr, and xenon light of intensity 130 mW/cm$^2$ was irradiated from the light energy generator 7 vertically onto the substrate. Thus, a p-type a-Si layer (B content: $5\times10^{-3}$ atomic %) having a thickness of 400 Å was deposited on the substrate 2 at a film forming rate of 20 Å/sec. The light energy was uniformly irradiated onto the gas flowing near the substrate 2 placed inside the deposition chamber 1. The decomposition product other than a-Si and B and residual unreacted source gases were evacuated through the gas exhaust pipe 20. At the same time, fresh source gas mixture was continuously supplied through the gas supply pipe 17.

The a-Si layers obtained by the present invention were evaluated by the following method. Comb-shaped Al gap electrodes (gap length: 250μ; width: 5 mm) were formed on a-Si layers formed on substrates, and dark currents were measured. Dark conductivity $\sigma d$ was determined.

The gap electrodes were formed in the following manner. After the a-Si layers formed in the above manner were placed in a deposition chamber and the deposition chamber was reduced once in pressure to $10^{-6}$ Torr, the vaccum pressure was adjusted to $10^{-5}$ Torr. Al was deposited on the respective a-Si layers to a thickness of 1,500 Å at a film forming rate of 20 Å/sec. The Al films formed in this manner were etched using pattern masks of predetermined patterns, thereby obtaining the gap electrodes.

The dark conductivity $\sigma d$ obtained is shown in Table 4.

EXAMPLES 16-21

P-type a-Si layers were formed following the same procedures as in Example 15 except that silicon compounds Nos. 2 to 7 in Table 1 were individually used as raw materials for supplying Si and the substrate temperature was set as in Table 4. The dark conductivity σd of the obtained a-Si layers was measured following the same procedures as in Example 15. The obtained results are shown in Table 4.

COMPARATIVE EXAMPLE 3

A p-type a-Si layer was formed following the same procedures as in Example 17 except that $Si_2H_6$ was used as a raw material for supplying Si. The dark conductivity σd of the obtained a-Si layer was measured following the same precedures as in Example 15. The obtained result is shown in Table 4.

EXAMPLE 22

N-type a-Si layers (4,000 Å thickness) doped with phosphorus atoms as an n-type impurity were formed following the same procedures as in Example 15 except that the gas supply source 11 filled with an n-type impurity introducing gas $PH_3$ diluted with $H_2$ (to a dilution degree of 0.05 mol %) was used in place of the $B_2H_6$ gas supply source 9, and the flow rate of the $PH_3$ gas was adjusted such that the mixing rate of the $PH_3$ gas and the gas of silicon compound No. 1, P/Si, was $5 \times 10^{-3}$ mol/mol and that the flow rate of the gas mixture was 150 SCCM. Comb-shaped Al gap electrodes were formed on the n-type a-Si layer formed in this manner following the same procedures as in Example 15, and the dark conductivity σd of the obtained films was measured. The obtained results are shown in Table 5.

EXAMPLES 23-28

N-type a-Si layers were formed following the same procedures as in Example 22 except that silicon compounds Nos. 2 to 7 in Table 1 (Examples 23 to 28) were individually used as raw materials for supplying Si, and the substrate temperature was set as in Table 5. The dark conductivity σd of the obtained a-Si layer was measured following the same procedures as in Example 15. The obtained results are shown in Table 5.

COMPARATIVE EXAMPLE 4

An n-type a-Si layer was formed following the same procedures as in Example 24 except that $Si_2H_6$ was used as a raw material for supplying Si. The dark conductivity σd of the obtained a-Si layer was measured following the same procedures as in Example 15. The obtained results are shown in Table 5.

EXAMPLES 29 to 42 p- and n-type a-Si layers (Examples 29 to 42) were formed following the same procedures as in Examples 15 to 28 except that light from a high-pressure mercury lamp having an intensity of 150 mW/cm² was used in place of a xenon lamp having a light intensity of 130 mW/cm². The dark conductivity σd of the obtained a-Si layers was measured following the same procedures as in Example 15. The obtained results are shown in Tables 6 and 7.

COMPARATIVE EXAMPLES 5 and 6

A p-type a-Si layer (Comparative Example 5) and an n-type a-Si layer (Comparative Example 6) were formed following the procedures of Examples 35 and 42, respectively, except that $Si_2H_6$ was used as a raw material for supplying Si. The dark conductivity σd of the obtained a-Si layers was measured following the same procedures as in Example 15. The obtained results are shown in Table 6 (Comparative Example 5) and Table 7 (Comparative Example 6).

The results obtained in Examples 15 to 42 and comparative Examples 3 to 6 can be summarized as follows. As for the film forming rate, as can be seen from the corresponding evaluation columns in Tables 4 to 8, when xenon lamp light having an intensity of 130 mW/cm² was used and the substrate temperature was 80° C., the film forming rate in Comparative Examples 3 and 4 was 12 Å/sec while that in Examples 17, 19, 24 and 26 was 22 to 25 Å/sec. When a high-pressure mercury lamp having an intensity of 150 mW/cm² was used and the substrate temperature was 100° C., the film forming rate in Comparative Examples 5 and 6 was 15 Å/sec while that in Examples 35 and 32 of the present invention was as good as 23 to 30 Å/sec. In any of Examples 15 to 42 of the present invention, an a-Si layer having a satisfactory doping efficiency and a high dark conductivity σd was obtained.

EXAMPLE 43

A p-i-n type diode device as shown in FIG. 2 was manufactured in the manner described below using the apparatus shown in FIG. 1, silicon compound No. 1 in Table 1 as a raw material for supplying Si, and xenon light having an intensity of 130 mW/cm² as excitation energy, and setting the substrate temperature at 80° C.

A substrate 21 ["Corning #7059": transparent conductive film (polyester-based)] was set on the support 3 inside the deposition chamber 1. Silicon compound No. 1 and $B_2H_6$ gas were introduced into the chamber 1 from the gas supply sources 9 and 10 so as to form a p-type a-Si layer 23, in the same conditions as in Example 15.

When the thickness of the p-type a-Si layer 23 being formed reached 400 Å, the valves 14-1, 16-1, 14-2, and 16-2 connected to the gas supply sources 9 and 10 were closed to stop any further supply of gases to the deposition chamber 1. After the gases in the deposition chamber 1 were evacuated by the evacuation unit (not shown), the valves 14-1 and 16-1 were opened and only the source gas of silicon compound No. 1 for supplying Si was introduced into the chamber 1 at a flow rate of 150 SCCM.

In the same manner as in formation of the p-type a-Si layer 23, light energy irradiation was performed to form an undoped or i-type a-Si layer 24 (5,000 Å thickness) at the same film forming rate as that of the layer 23.

The valves 14-3 and 16-3 coupled to the gas supply source 11 filled with the n-type impurity introducing gas $PH_3$ diluted to a dilution degree of 0.05 mol % with $H_2$ gas were opened to introduce $PH_3$ gas into the chamber 1. An n-type a-Si layer 25 (400 Å thickness) doped with phosphorus was formed on the i-type a-Si layer 24 under the same conditions as in Example 8 at the same film forming rate as in the formation of the p-type a-Si layer 23, thereby forming a semiconductor layer 27 comprising the layers 23, 24, and 25.

By vacuum deposition (at a pressure of $1 \times 10^{-5}$ Torr), an Al thin film electrode 26 of 1,000 Å thickness was formed on the p-i-n type a-Si semiconductor layer 27 formed in this manner, thereby completing the p-i-n type diode device.

For the p-i-n type diode device manufactured in this Example, evaluations were made of the rectification characteristics (ratio of forward current to reverse current at a voltage of 1 V) of the device (area 1 cm²), then n value (the n value for a current formula J=J{exp- (eV/nkT)−1} of a p-n junction), and light irradiation characteristics (a conversion efficiency at an irradiation intensity of about 100 mW/cm², a free terminal voltage, and a short-circuit current). The obtained results are shown in Table 8.

EXAMPLE 44–49

A three-layered p-i-n type a-Si semiconductor layer was formed following the same procedures as in Example 43 except that silicon compounds Nos. 2 to 7 (Examples 44 to 49) in Table 1 were individually used as raw materials for supplying Si and the substrate temperature was set as shown in Table 8. A p-i-n type diode device was prepared using this layer. The rectification characteristics, the n value, and the light irradiation characteristics of the obtained device were evaluated following the same procedures as in Example 43. The obtained results are shown in Table 8.

COMPARATIVE EXAMPLE 7

A three-layered p-i-n type a-Si semiconductor layer was formed following the same procedures as in Example 45 except that $Si_2H_6$ was used as a raw material for supplying Si. A p-i-n type diode device was manufactured using the obtained p-i-n type a-Si semiconductor layer. The rectification characteristics, the n value, and the light irradiation characteristics of the obtained p-i-n type diode device were examined following the same procedures as in Example 43. The obtained results are shown in Table 9.

EXAMPLES 50–56

Three-layered p-i-n type a-Si semiconductor layers (Examples 50 to 56) were formed following the same procedures as in Examples 43 to 49 except that light from a high-pressure mercury lamp having an intensity of 150 mW/cm² was used in place of xenon light having an intensity of 130 mW/cm². P-i-n type diode devices were manufactured using these semiconductor layers. The rectification characteristics, the n value, and the light irradiation characteristics of the obtained devices were examined following the same procedures as in Example 43. The obtained results are shown in Table 9.

COMPARATIVE EXAMPLE 8

A three-layered p-i-n type a-Si semiconductor layer was formed following the same procedures as in Example 56 except that $Si_2H_6$ was used in place of a raw material for supplying Si, and a p-i-n type diode device was manufactured using this semiconductor layer. The rectification characteristics, the n value, and the light irradiation characteristics of the obtained p-i-n type diode device were evaluated following the same procedures as in Example 43. The obtained results are shown in Table 10.

The results of Examples 43 to 56 and Comparative Examples 7 and 8 are summarized as follows. The p-i-n type diode devices obtained in Examples 43 to 56 had excellent rectification characteristics, i.e, rectification ratios of $3 \times 10^7$ to $8 \times 10^8$; and excellent light irradiation characteristics, i.e., a conversion ratio of 8% or more, a free terminal voltage of 0.9 V, and a short-circuit current of 13 mA/cm².

EXAMPLE 57

An i-type a-Si (amorphous-Si) layer was formed using the apparatus shown in FIG. 1 and silicon compound No. 1 in Table 10 as a starting material for forming a deposition layer and following the same procedures.

A substrate [Trade name: "Corning #7059"; transparent conductive film (polyester-based); available from Dow-Corning Inc.] was set on the support 3 inside the deposition chamber 1. The interior of the chamber 1 was reduced in pressure to $10^{-6}$ Torr by the evacuation unit (not shown) through the gas exhaust pipe 20. The heater 4 was turned on to keep the substrate at a temperature of 80° C. The valves 14-1 and 16-1 of the gas supply source 9 filled with silicon compound No. 1 were opened to supply the source gas to the deposition chamber 1.

The gas flow rate was measured by the flow meter 15-1 and was adjusted at 150 SCCM. While the pressure inside the deposition chamber was set at 0.1 Torr, xenon light at an intensity of 130 mW/cm² was emitted from the light energy generator 7 and was vertically irradiated onto the substrate. Thus, an i-type a-Si layer having a thickness of 4,000 Å was deposited on the substrate 2 at a film forming rate of 20 Å/sec. The light energy was uniformly irradiated onto the gas flowing near the substrate 2 placed inside the chamber 1. The decomposition product except for a-Si and any unreacted source gas were exhausted through the gas exhaust pipe 20, while fresh source gas was continuously supplied to the chamber through the gas supply pipe 17.

The a-Si layer formed in this manner by the method of the present invention was evaluated in the following manner. Comb-shaped Al gap electrodes (gap length: 250μ; width: 5 mm) were formed on the respective a-Si layers on the substrates. Photocurrents (irradiation intensity AMI: about 100 mW/cm²) and dark currents were measured. The photoconductivity σp and the ratios (σp/σd) of the photoconductivity σp to the dark conductivity σd were determined.

The gap electrodes were formed in accordance with the following procedures. After an a-Si layer formed in the manner described above was placed in the deposition chamber, the chamber was evacuated to a vacuum pressure of $10^{-6}$ Torr. Then, the vacuum pressure inside the chamber was adjusted to $10^{-5}$ Torr, and Al was deposited on the a-Si layer to a thickness of 1,500 Å at a film forming rate of 20 Å/sec. The Al film was patterned using a predetermined pattern mask.

The dark conductivity σp and the ratio σp/σd of the obtained structure are shown in Table 11.

EXAMPLES 58–60

I-type a-Si layer were formed following the same procedures as in Example 57 except that silicon compounds Nos. 2 to 4 (Examples 58 to 60) in Table 11 were individually used as starting materials for forming a deposition layer and the substrate temperature was set as shown in Table 11. The obtained a-Si layers were evaluated following the same procedures as in Example 57. The obtained evaluation results are shown in Table 11.

COMPARATIVE EXAMPLE 9

An i-type Si layer was formed following the same procedures as in Example 57 except that $Si_2H_6$ was used as a raw material for supplying Si. The obtained a-Si layer was evaluated following the same procedures as in Example 57. The obtained results are shown in Table 11.

EXAMPLES 61-64

A-Si layers were formed following the same procedures as in Example 57 except that silicon compounds Nos. 1 to 4 (Examples 61 to 64) in Table 10 were individually used as starting materials for forming deposition films, "Corning #7059" was used for substrates, the substrate temperature was set as shown in Table 12, and light from a high-pressure mercury lamp having an intensity of 150 mm/cm$^2$ was vertically irradiated onto the substrates. The obtained a-Si layers were evaluated following the same procedures as in Example 57. The obtained evaluation results are shown in Table 12.

COMPARATIVE EXAMPLE 10

An i-type a-Si layer was formed following the same procedures as in Example 62 except that Si$_2$H$_6$ was used as a raw material for supplying Si. The obtained a-Si layer was evaluated following the same procedures as in Example 57. The obtained evaluation results are shown in Table 12.

The results of Examples 57 to 64 and Comparative Examples 9 and 10 can be summarized as follows. As for the film forming rate, as can be seen from the results indicated in Tables 11 and 12, when xenon light having an intensity of 130 mW/cm$^2$ was used and the substrate temperature was 80° C., the film forming rate in Comparative Example 9 was 12 Å/sec while that in Examples 57 and 60 was 20 Å/sec. When a high-pressure mercury lamp having an intensity of 150 mW/cm$^2$ was used and the substrate temperature was 60° C., the film forming rate in Comparative Example 10 was 10 Å/sec while that in Examples 62 and 63 was 20 Å/sec. In any of Examples 57 to 64, the photoconductivity $\sigma p$ was $2.5 \times 10^{-5}$ to $1.4 \times 10^{-4}$ and the ratio $\sigma p/\sigma d$ was $4 \times 10^3$ to $9 \times 10^4$, indicating good results.

EXAMPLE 65

P-type Si layers doped with boron were formed using the apparatus shown in FIG. 1, silicon compound No. 1 in Table 10 as a raw material for supplying Si, and B$_2$H$_6$ as a p-type impurity introducing gas, in accordance with the following procedures.

A substrate 2 ["Corning #7059"; transparent conductive film (polyester-based); available from Dow-Corning Inc.] was set on the support 3 inside the deposition chamber 1. The interior of the deposition chamber 1 was evacuated to a vacuum pressure of 10$^{-6}$ Torr by the evacuation unit (not shown) through the gas exhaust pipe 20. The heater 4 was turned on to keep the substrate at 80° C. The valves 14-1 and 16-1 of the gas supply source 9 filled with the gas of silicon compound No. 1, and the valves 14-2 and 16-2 of the gas supply source 10 filled with p-type impurity introducing gas B$_2$H$_6$ diluted with H$_2$ gas to a dilution degree of 0.025 mol % were opened to introduce the source gas mixture into the deposition chamber 1.

The flow rates of the gas components were monitored by the corresponding flow meters 15-1 and 15-2, and the gas of silicon compound No. 1 and B$_2$H$_6$ gas were mixed at a mixing rate B/Si=$5 \times 10^{-3}$ mol/mol so that the flow rate of the gas mixture was 150 SCCM. The pressure inside the chamber 1 was kept at 0.1 Torr, and xenon light having an intensity of 130 mW/cm$^2$ from the light energy generator 7 was vertically irradiated onto the substrate. A p-type a-Si layer (B content: $5 \times 10^{-3}$ atomic %) having a layer thickness of 400 Å was formed on the substrate 2 at a film forming rate of 20 Å/sec. The light energy was uniformly irradiated onto the gas flowing near the substrate 2 placed inside the deposition chamber 1. The decomposition product other than a-Si and B and any residual unreacted source gases were evacuated through the gas exhaust pipe 20. Meanwhile, fresh gas mixture was continuously supplied through the gas supply pipe 17.

The a-Si layer formed by the method of the present invention was evaluated in the following manner. A comp-shaped Al gap electrode (gap length: 250$\mu$; width: 5 mm) was formed on the a-Si layer on the substrate. The dark current was measured, and the dark conductivity $\sigma d$ was determined.

The gap electrode was formed in the following manner. The a-Si layer formed in the above manner was placed in a deposition chamber. After the deposition chamber was reduced to a vacuum pressure of 10$^{-6}$ Torr, the vacuum pressure was adjusted to 10$^{-5}$ Torr. Al was deposited on the a-Si film to a thickness of 1,500 Å at a deposition rate of 20 Å/sec. The Al film formed was etched by a pattern mask having a predetermined pattern.

The obtained dark conductivity $\sigma d$ is shown in Table 13.

EXAMPLE 66-68

P-type a-Si layers were formed following the same procedures as in Example 65 except that silicon compounds Nos. 2 to 4 (Examples 66 to 68) in Table 10 were used as raw materials for supplying Si and the substrate temperature was set as shown in Table 13. The dark conductivity $\sigma d$ of the obtained a-Si layers was measured following the same procedures as in Example 65. The obtained results are shown in Table 13.

COMPARATIVE EXAMPLE 11

A p-type a-Si layer was formed following the same procedures as in Example 65 except that Si$_2$H$_6$ was used as a raw material for supplying Si. The dark conductivity $\sigma d$ of the obtained a-Si layer was measured following the same procedures as in Example 65. The obtained results are shown in Table 13.

EXAMPLE 69

An a-Si layer (4,000 Å thickness) doped with phosphorus as an n-type impurity was formed following the same procedures as in Example 65 except that the gas supply source 11 filled with an n-type impurity supplying gas PH$_3$ diluted with H$_2$ gas to a dilution degree of 0.05 mol % was used in place of the B$_2$H$_6$ gas supply source 9, and that the flow rate of the PH$_3$ gas was adjusted such that the mixing ratio of the pH$_3$ gas to the gas of silicon compound No. 1, P/Si, was $5 \times 10^{-3}$ mol/mol and the flow rate of the gas mixture was 150 SCCM. A comb-shaped interdigital Al gap electrode was formed on the formed n-type a-Si layer following the same procedures as in Example 65, and the dark conductivity $\sigma d$ was calculated. The obtained results are shown in Table 13.

EXAMPLES 70-72

N-type a-Si layers were formed following the same procedures as in Example 69 except that silicon compounds Nos. 2 to 4 (Comparative Examples 70 to 72) in Table 10 were used as raw materials for supplying Si, and the substrate temperature was set as shown in Table 13. The dark conductivity $\sigma d$ of the obtained a-Si layer was measured following the same procedures as in Example 65. The obtained results are shown in Table 13.

COMPARATIVE EXAMPLE 12

An n-type a-Si layer was formed following the same procedures as in Example 69 except that $Si_2H_6$ was used as a raw material for supplying Si. The dark conductivity $\sigma d$ of the obtained a-Si layer was measured following the same procedures as in Example 65. The obtained results are shown in Table 13.

EXAMPLES 73-80 p- and n-type a-Si layers (Examples 73 to 80) were formed following the same procedures as in Examples 65 to 72 except that light from a high-pressure mercury lamp having an intensity of 150 mW/cm$^2$ was used in place of xenon light having an intensity of 130 mW/cm$^2$. The dark conductivity $\sigma d$ of the obtained a-Si film was measured following the same procedures as in Example 65. The obtained results are shown in Table 14.

COMPARATIVE EXAMPLES 13 & 14

A p-type a-Si layer (Comparative Example 3) was formed following the same procedures as in Example 74 except that $Si_2H_6$ was used as a raw material for supplying Si. Two n-type a-Si layers (Comparative Example 4) were formed following the same procedures as in Example 78. The dark conductivity $\sigma d$ of the obtained a-Si films was measured following the same procedures as in Example 65. The obtained results are shown in Table 14.

The results obtained with the layers of Examples 65 to 80 and Comparative Examples 11 to 14 are summarized as follows. As for the film forming rate, as can be seen from the results indicated in Tables 14 and 15, when xenon light having an intensity of 130 mW/cm$^2$ was used and the substrate temperature was 80° C., the film forming rate in Comparative Examples 11 and 12 was 10 Å/sec while that in Examples 65, 68, 69, and 72 was 20 to 25 Å/sec. When a high-pressure mercury lamp having an intensity of 150 mW/cm$^2$ was used and the substrate temperature was 60° C., the film forming rate in Comparative Examples 13 and 14 was 15 Å/sec while that in Examples 74, 75, 78, and 79 was 23 to 30 Å/sec. In any one of Examples 65 to 80, a satisfactory doping effect was obtained, and an a-Si layer having a high dark conductivity $\sigma d$ could be obtained.

EXAMPLE 81

A p-i-n type diode device as shown in FIG. 2 was manufactured using the apparatus as shown in FIG. 1, silicon compound No. 1 in Table 10 as a raw material for supplying Si, and xenon light having an intensity of 130 mW/cm$^2$ as excitation energy, and setting the substrate temperature at 100° C. A p-i-n type diode device as shown in FIG. 2 was manufactured in the following manner.

A substrate 21 with a thin film electrode 22 (ITO was deposited to a thickness of 500 Å on glass) was set on the support 3 in the deposition chamber 1. The gas of silicon compound No. 1 and $B_2H_6$ were introduced from the gas supply sources 9 and 10, respectively, under the same operating conditions as in Example 65 so as to form a p-type a-Si layer 23.

When the thickness of the p-type a-Si layer 23 reached 400 Å, the valves 14-1, 16-1, 14-2, and 16-2 communicating with the sources 9 and 10 were all closed to stop supply of the gases to the deposition chamber 1. The gases in the deposition chamber were evacuated by the evacuation unit (not shown). Then, the valves 14-1 and 16-1 were opened again to introduce the gas of silicon compound No. 1 alone into the deposition chamber 1 at a flow rate of 150 SCCM.

Light energy irradiation was performed in the same manner as in formation of the p-type a-Si layer 23 so as to form an undoped or i-type a-Si layer 24 (5,000 Å thickness) at the same rate.

The valves 14-3 and 16-3 communicating with the gas supply source 11 filled with the n-type impurity introducing gas $PH_3$ diluted with $H_2$ gas to a dilution degree of 0.05 mol% were opened to introduce the $PH_3$ gas into the deposition chamber 1. An n-type a-Si layer 25 (400 Å thickness) doped with phosphorus was formed on the i-type a-Si layer 24 under the same conditions as in Example 69 at the same rate as that of forming the p-type a-Si layer 23. Thus, a semiconductor layer 27 comprising the three a-Si films 23, 24, and 25 was formed.

An Al thin electrode layer 26 of 1,000 Å thickness was formed by vacuum deposition $1 \times 10^{-5}$ Torr on the p-i-n type a-Si semiconductor layer 27 formed in this manner by the method of the present invention to complete the p-i-n type diode device.

The p-i-n type diode device obtained in this Example was evaluated for the rectification characteristics (ratio of the forward current to the reverse current at a voltage of 1 V) per area of 1 cm$^2$, the n value (the n value for a current formula $J = J\{\exp(eV/nkT) - 1\}$ of a p-n junction), and the light irradiation characteristics (a conversion efficiency, a free terminal voltage and a short-circuit current at a light irradiation intensity of about 100 mW/cm$^2$). The obtained results are shown in Table 15.

EXAMPLES 82-84

Three-layered p-i-n type a-Si semiconductor layers were formed following the same procedures as in Example 81 exept that silicon compounds Nos. 2 to 4 (Examples 82 to 84) in Table 10 were individually used as raw materials for supplying Si and the substrate temperature was set as shown in Table 15. A p-i-n type diode device was manufactured using this layer, and the rectification characteristics, the n value, and the light irradiation characteristics of the obtained device were evaluated following the same procedures as in Example 81. The obtained results are shown in Table 15.

COMPARATIVE EXAMPLE 15

A three-layered p-i-n type a-Si semiconductor layer was formed following the same procedures as in Example 81 except that $Si_2H_6$ was used as a raw material for supplying Si. A p-i-n type diode device was manufactured using the obtained layer. The rectification characteristics, the n value, and the light irradiation characteristics of the obtained p-i-n type diode device were evaluated following the same procedures as in Example 81. The results are shown in Table 15.

EXAMPLES 85-88

Three-layered p-i-n type a-Si semiconductor layers (Examples 85 to 88) were formed following the same procedures as in Examples 81 to 84 except that light of a high-pressure mercury lamp having an intensity of 150 mW/cm$^2$ was used in place of xenon light having an intensity of 130 mW/cm$^2$. The obtained layers were used to manufacture p-i-n type diode devices. The rectification characteristics, the n value, and the light irradiation characteristics of the obtained devices were examined following the same procedures as in Example 81. The obtained results are shown in Table 15.

COMPARATIVE EXAMPLE 16

A three-layered p i-n type a-Si semiconductor layer was formed following the same procedures as in Example 88 except that $Si_2H_6$ was used as a raw material for supplying Si. A p-i-n type diode device was manufactured by the obtained layer. The rectification characteristics, the n value, and the light irradiation characteristics of the device were evaluated following the same procedures as in Example 81. The obtained results are shown in Table 15.

The results obtained with Examples 81 to 88 and Comparative Examples 15 and 16 can be summarized as follows. The p-i-n type diode devices formed in Examples 81 to 88 had good rectification ratios of $7 \times 10^7$ to $1 \times 10^9$ and excellent light irradiation characteristics, i.e., a conversion efficiency of 8% or more, a free terminal voltage of 0.9 V, and a short-circuit current of 12 $mA/cm^2$.

In summary, according to the method of the present invention, light energy is used as excitation energy, and a source gas which is easily excited and decomposed by light energy is used. Therefore, an a-Si deposition film can be formed at a high rate and with a low energy level. An a-Si deposition film having uniform electrical and optical characteristics and stable quality can be formed. According to the method of the present invention, a substrate of a material having a low heat resistance which cannot be used in the conventional glow discharge deposition method or thermal energy deposition method can be used. Energy consumption by high-temperature heating of the substrate can be avoided. Since light energy can be controlled to uniformly irradiate a predetermined space occupied by a source gas to be irradiated therewith, a thick deposition film can be uniformly formed within a wide area and a deposition film of a large area can be formed with good precision.

TABLE 1

| Silicon compound | Structural formula |
|---|---|
| No. 1 | 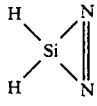 |
| No. 2 | 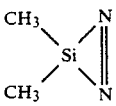 |
| No. 3 | 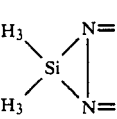 |
| No. 4 | 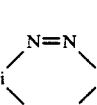 |
| No. 5 | 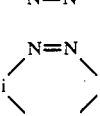 |
| No. 6 | 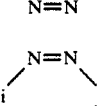 |
| No. 7 | 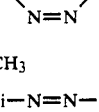 |

TABLE 2

| | Comparative Example | Example 1 | Example 2 | Example 3 | Example 4 | Example 5 | Example 6 | Example 7 |
|---|---|---|---|---|---|---|---|---|
| Si source compound | $Si_2H_6$ | No. 1 | No. 2 | No. 3 | No. 4 | No. 5 | No. 6 | No. 7 |
| Substrate temperature (°C.) | 100 | 60 | 60 | 80 | 60 | 80 | 60 | 100 |
| $\sigma p/\sigma d$*1 | $1 \times 10^3$ | $8 \times 10^4$ | $4 \times 10^3$ | $5 \times 10^3$ | $8 \times 10^4$ | $1.1 \times 10^4$ | $4.1 \times 10^3$ | $1 \times 10^3$ |
| $\sigma p$*2 | $1 \times 10^{-5}$ | $1.0 \times 10^{-4}$ | $2.4 \times 10^{-5}$ | $2.8 \times 10^{-5}$ | $1.2 \times 10^{-4}$ | $4 \times 10^{-5}$ | $2.5 \times 10^{-5}$ | $1.1 \times 10^{-5}$ |

*1 $\sigma p/\sigma d$: Ratio of photoconductivity to dark conductivity
*2 $\sigma p$: Photoconductivity $(\Omega \cdot cm)^{-1}$

TABLE 3

| | Comparative Example | Example 8 | Example 9 | Example 10 | Example 11 | Example 12 | Example 13 | Example 14 |
|---|---|---|---|---|---|---|---|---|
| Si source compound | $Si_2H_6$ | No. 1 | No. 2 | No. 3 | No. 4 | No. 5 | No. 6 | No. 7 |
| Substrate temperature (°C.) | 110 | 60 | 60 | 80 | 60 | 80 | 60 | 100 |
| $\sigma p/\sigma d$*1 | $1.3 \times 10^3$ | $9 \times 10^4$ | $4.4 \times 10^3$ | $8.6 \times 10^3$ | $8.8 \times 10^4$ | $1.3 \times 10^4$ | $4.5 \times 10^3$ | $1.5 \times 10^3$ |
| $\sigma p$*2 | $1.2 \times 10^{-5}$ | $1.5 \times 10^{-4}$ | $2.7 \times 10^{-5}$ | $3.8 \times 10^{-5}$ | $1.4 \times 10^{-4}$ | $4.3 \times 10^{-5}$ | $2.8 \times 10^{-5}$ | $1.4 \times 10^{-5}$ |

*1 $\sigma p/\sigma d$: Ratio of photoconductivity to dark conductivity
*2 $\sigma p$: Photoconductivity $(\Omega \cdot cm)^{-1}$

TABLE 4

| | Comparative Example 3 | Example | | | | | | |
|---|---|---|---|---|---|---|---|---|
| | | 15 | 16 | 17 | 18 | 19 | 20 | 21 |
| Si source supplying material | $Si_2H_6$ | Silicon compound | | | | | | |
| | | No. 1 | No. 2 | No. 3 | No. 4 | No. 5 | No. 6 | No. 7 |
| Impurity introducing source material | | $B_2H_6$ | | | | | | |
| Substrate temperature (°C.) | 80 | 60 | 60 | 80 | 60 | 80 | 60 | 100 |
| Dark conductivity $\sigma d$ $(\Omega \cdot cm)^{-1}$ | $1 \times 10^{-3}$ | $3.7 \times 10^{-2}$ | $4.4 \times 10^{-3}$ | $5.8 \times 10^{-3}$ | $3.8 \times 10^{-2}$ | $1 \times 10^{-2}$ | $4.2 \times 10^{-3}$ | $1.3 \times 10^{-1}$ |
| Film forming rate (Å/sec) | 12 | 25 | 18 | 20 | 25 | 20 | 20 | 18 |

TABLE 5

| | Comparative Example 4 | Example | | | | | | |
|---|---|---|---|---|---|---|---|---|
| | | 22 | 23 | 24 | 25 | 26 | 27 | 28 |
| Si source supplying material | $Si_2H_6$ | Silicon compound | | | | | | |
| | | No. 1 | No. 2 | No. 3 | No. 4 | No. 5 | No. 6 | No. 7 |
| Impurity introducing source material | | $PH_3$ | | | | | | |
| Substrate temperature (°C.) | 80 | 60 | 60 | 80 | 60 | 80 | 60 | 100 |
| Dark conductivity $\sigma d$ $(\Omega \cdot cm)^{-1}$ | $8 \times 10^{-3}$ | $5.2 \times 10^{-1}$ | $2.2 \times 10^{-2}$ | $2.6 \times 10^{-2}$ | $5.8 \times 10^{-1}$ | $8 \times 10^{-2}$ | $2.1 \times 10^{-2}$ | $9 \times 10^{-3}$ |
| Film forming rate (Å/sec) | 12 | 25 | 18 | 20 | 25 | 20 | 20 | 18 |

TABLE 6

| | Comparative Example 5 | Example | | | | | | |
|---|---|---|---|---|---|---|---|---|
| | | 29 | 30 | 31 | 32 | 33 | 34 | 35 |
| Si source supplying material | $Si_2H_6$ | Silicon compound | | | | | | |
| | | No. 1 | No. 2 | No. 3 | No. 4 | No. 5 | No. 6 | No. 7 |
| Impurity introducing source material | | $B_2H_6$ | | | | | | |
| Substrate temperature (°C.) | 100 | 60 | 60 | 80 | 60 | 80 | 60 | 100 |
| Dark conductivity $\sigma d$ $(\Omega \cdot cm)^{-1}$ | $1.4 \times 10^{-3}$ | $4.0 \times 10^{-2}$ | $4.9 \times 10^{-3}$ | $6.0 \times 10^{-3}$ | $4.9 \times 10^{-2}$ | $1.3 \times 10^{-2}$ | $4.5 \times 10^{-3}$ | $1.6 \times 10^{-1}$ |
| Film forming rate (Å/sec) | 15 | 30 | 23 | 25 | 30 | 25 | 24 | 24 |

TABLE 7

| | Comparative Example 6 | Example | | | | | | |
|---|---|---|---|---|---|---|---|---|
| | | 36 | 37 | 38 | 39 | 40 | 41 | 42 |
| Si source supplying material | $Si_2H_6$ | Silicon compound | | | | | | |
| | | No. 1 | No. 2 | No. 3 | No. 4 | No. 5 | No. 6 | No. 7 |
| Inpurity introducing source material | | $PH_3$ | | | | | | |
| Substrate | 100 | 60 | 60 | 80 | 60 | 80 | 60 | 100 |

TABLE 7-continued

|  | Comparative Example 6 | Example 36 | Example 37 | Example 38 | Example 39 | Example 40 | Example 41 | Example 42 |
|---|---|---|---|---|---|---|---|---|
| temperature (°C.) | | | | | | | | |
| Dark conductivity $\sigma d$ $(\Omega \cdot cm)^{-1}$ | $1 \times 10^{-2}$ | $5.8 \times 10^{-1}$ | $2.5 \times 10^{-2}$ | $3.0 \times 10^{-2}$ | $5.9 \times 10^{-1}$ | $8.6 \times 10^{-2}$ | $2.5 \times 10^{-2}$ | $9.4 \times 10^{-3}$ |
| Film forming rate (Å/sec) | 15 | 30 | 23 | 25 | 30 | 26 | 25 | 25 |

TABLE 8

|  | Comparative Example 7 | Example 43 | Example 44 | Example 45 | Example 46 | Example 47 | Example 48 | Example 49 |
|---|---|---|---|---|---|---|---|---|
| Substrate temperature (°C.) | 80 | 60 | 60 | 80 | 60 | 80 | 60 | 100 |
| Rectification ratio | $3 \times 10^7$ | $8 \times 10^8$ | $7 \times 10^7$ | $1 \times 10^8$ | $8 \times 10^8$ | $2 \times 10^8$ | $7 \times 10^7$ | $3 \times 10^7$ |
| n value | 1.6 | 1.2 | 1.5 | 1.4 | 1.15 | 1.35 | 1.55 | 1.6 |
| Conversion efficiency (%) | 8 | 9 | 8.2 | 8.4 | 9 | 8.7 | 8.2 | 8 |
| Free terminal voltage (V) | 0.9 | 0.92 | 0.9 | 0.9 | 0.93 | 0.9 | 0.9 | 0.9 |
| Short-circuit current (mA/cm²) | 12 | 14 | 12.8 | 13 | 14 | 13.5 | 12.8 | 13 |

TABLE 9

|  | Comparative Example 8 | Example 50 | Example 51 | Example 52 | Example 53 | Example 54 | Example 55 | Example 56 |
|---|---|---|---|---|---|---|---|---|
| Substrate temperature (°C.) | 100 | 60 | 60 | 80 | 60 | 80 | 60 | 100 |
| Rectification ratio | $5 \times 10^7$ | $1 \times 10^9$ | $1 \times 10^8$ | $3 \times 10^8$ | $9 \times 10^8$ | $4 \times 10^8$ | $9 \times 10^7$ | $5 \times 10^7$ |
| n value | 1.5 | 1.15 | 1.45 | 1.35 | 1.2 | 1.30 | 1.45 | 1.55 |
| Conversion efficiency (%) | 8.1 | 9.2 | 8.3 | 8.5 | 9.2 | 8.7 | 8.4 | 8.2 |
| Free terminal voltage (V) | 0.9 | 0.92 | 0.9 | 0.9 | 0.9 | 0.92 | 0.9 | 0.9 |
| Short-circuit current (mA/cm²) | 12 | 14 | 13 | 13.2 | 14 | 13.5 | 13 | 12.9 |

TABLE 10

| Silicon compound | Structural formula |
|---|---|
| No. 1 | H–Si(H)(H)–N₃ (H–Si–N₃ with H above and H below) |
| No. 2 | H–Si(H)(N₃)–N₃ (H–Si–N₃ with H above and N₃ below) |
| No. 3 | CH₃–Si(CH₃)(N₃)–N₃ (CH₃–Si–N₃ with CH₃ above and N₃ below) |
| No. 4 | Cl–Si(Cl)(N₃)–N₃ (Cl–Si–N₃ with Cl above and N₃ below) |

TABLE 11

|  | Comparative Example 9 | Example 57 | Example 58 | Example 59 | Example 60 |
|---|---|---|---|---|---|
| Source gas compound | Si₂H₆ | No. 1 | No. 2 | No 3 | No. 4 |
| Substrate temperature (°C.) | 80 | 80 | 60 | 60 | 80 |
| $\sigma p/\sigma d$*1 | $1 \times 10^3$ | $2.5 \times 10^4$ | $8 \times 10^4$ | $4 \times 10^3$ | $1.1 \times 10^4$ |
| $\sigma p$*2 | $1 \times 10^{-5}$ | $8 \times 10^{-5}$ | $1.2 \times 10^{-4}$ | $2.5 \times 10^{-5}$ | $4 \times 10^{-5}$ |
| Film forming rate | 12 | 20 | 18 | 20 | 20 |

TABLE 11-continued

|  | Comparative Example 9 | Example 57 | Example 58 | Example 59 | Example 60 |
|---|---|---|---|---|---|
| (Å/sec) | | | | | |

*[1] $\sigma p/\sigma d$: Ratio of photoconductivity to dark conductivity
*[2] $\sigma p$: Photoconductivity $(\Omega \cdot cm)^{-1}$

TABLE 12

|  | Comparative Example 10 | Example 61 | Example 62 | Example 63 | Example 64 |
|---|---|---|---|---|---|
| Source gas compound | $Si_2H_6$ | No. 1 | No. 2 | No. 3 | No. 4 |
| Substrate temperature (°C.) | 60 | 80 | 60 | 60 | 80 |
| $\sigma p/\sigma d$ *[1] | $1 \times 10^3$ | $3.6 \times 10^4$ | $9 \times 10^4$ | $5 \times 10^3$ | $1.3 \times 10^4$ |
| $\sigma p$ *[2] | $1.2 \times 10^{-5}$ | $8.6 \times 10^{-5}$ | $1.4 \times 10^{-4}$ | $2.8 \times 10^{-5}$ | $4.4 \times 10^{-5}$ |
| Film forming rate (Å/sec) | 10 | 22 | 20 | 20 | 20 |

*[1] $\sigma/\sigma d$: Ratio of photoconductivity to dark conductivity
*[2] $\sigma p$: Photoconductivity $(\Omega \cdot cm)^{-1}$

TABLE 13

|  | Comparative Example | | Example | | | | | | | |
|---|---|---|---|---|---|---|---|---|---|---|
|  | 11 | 12 | 65 | 69 | 66 | 70 | 67 | 71 | 68 | 72 |
| Si supplying source compound | $Si_2H_6$ | | No. 1 | | No. 2 | | No. 3 | | No. 4 | |
| Impurity introducing source compound | $B_2H_6$ | $PH_3$ | $B_2H_6$ | $PH_3$ | $B_2H_6$ | $PH_3$ | $B_2H_6$ | $PH_3$ | $B_2H_6$ | $PH_3$ |
| Substrate temperature (°C.) | 80 | 80 | 80 | 80 | 60 | 60 | 60 | 60 | 80 | 80 |
| Dark conductivity $\sigma d$ $(\Omega \cdot cm)^{-1}$ | $1 \times 10^{-3}$ | $8 \times 10^{-3}$ | $2 \times 10^{-2}$ | $3 \times 10^{-1}$ | $4.0 \times 10^{-2}$ | $5.9 \times 10^{-1}$ | $5.0 \times 10^{-3}$ | $2.4 \times 10^{-2}$ | $1 \times 10^{-2}$ | $8 \times 10^{-2}$ |
| Film forming rate (Å/sec) | 10 | 10 | 25 | 25 | 18 | 18 | 20 | 20 | 25 | 25 |

TABLE 14

|  | Comparative Example | | Example | | | | | | | |
|---|---|---|---|---|---|---|---|---|---|---|
|  | 13 | 14 | 73 | 77 | 74 | 78 | 75 | 79 | 76 | 80 |
| Si supplying source compound | $Si_2H_6$ | | No. 1 | | No. 2 | | No. 3 | | No. 4 | |
| Impurity introducing source compound | $B_2H_6$ | $PH_3$ | $B_2H_6$ | $PH_3$ | $B_2H_6$ | $PH_3$ | $B_2H_6$ | $PH_3$ | $B_2H_6$ | $PH_3$ |
| Substrate temperature (°C.) | 60 | 60 | 80 | 80 | 60 | 60 | 60 | 60 | 80 | 80 |
| Dark conductivity $\sigma d$ $(\Omega \cdot cm)^{-1}$ | $8 \times 10^{-3}$ | $1.3 \times 10^{-3}$ | $3 \times 10^{-2}$ | $3.5 \times 10^{-1}$ | $5.9 \times 10^{-1}$ | $6.3 \times 10^{-1}$ | $2.4 \times 10^{-1}$ | $2.7 \times 10^{-2}$ | $8 \times 10^{-2}$ | $8.2 \times 10^{-2}$ |
| Film forming rate (Å/sec) | 15 | 15 | 30 | 30 | 23 | 23 | 25 | 25 | 25 | 26 |

TABLE 15

|  | Comparative Example | | Example | | | | | | | |
|---|---|---|---|---|---|---|---|---|---|---|
|  | 15 | 16 | 81 | 85 | 82 | 86 | 83 | 87 | 84 | 88 |
| Si supplying source | $Si_2H_6$ | | No. 1 | | No. 2 | | No. 3 | | No. 4 | |

TABLE 15-continued

| | Comparative Example | | Example | | | | | | | |
|---|---|---|---|---|---|---|---|---|---|---|
| | 15 | 16 | 81 | 85 | 82 | 86 | 83 | 87 | 84 | 88 |
| compound Substrate temperature (°C.) | 100 | | 100 | | 60 | | 60 | | 80 | |
| Rectification ratio of diode | $3 \times 10^7$ | $5 \times 10^7$ | $6 \times 10^8$ | $7 \times 10^8$ | $8 \times 10^8$ | $1 \times 10^9$ | $7 \times 10^7$ | $1 \times 10^8$ | $2 \times 10^8$ | $4 \times 10^8$ |
| n value of diode | 1.6 | 1.5 | 1.25 | 1.25 | 1.2 | 1.15 | 1.5 | 1.4 | 1.35 | 1.30 |

We claim:

1. A process for forming a deposition film, wherein a gaseous atmosphere of a silicon compound selected from
   (i) a silicon compound having at least one azo group directly bonded to a silicon atom and
   (ii) a silicon compound having at least one azide group directly bonded to a silicon atom
is formed in a deposition chamber in which a substrate is placed, said compound is excited and decomposed utilizing light energy, and a deposition film containing silicon atoms is formed on said substrate.

2. A process for forming a deposition film, wherein a gaseous atmosphere of a silicon compound selected from
   (i) a silicon compound having at least one azo group directly bonded to a silicon atom and
   (ii) a silicon compound having at least one azide group directly bonded to a silicon atom,
and a compound containing atoms in a group III element or a group V element of the Periodic Table is formed in a deposition chamber in which a substrate is placed, the compounds are excited and decomposed utilizing light energy, and a deposition film containing silicon atoms and the atoms in the group III or V element of the Periodic Table is formed on said substrate.

3. A process according to claim 2, wherein the atoms in the group III element of the Periodic Table are atoms of an element selected from the group consisting of B, Al, Ga, In, and Tl.

4. A process according to claim 2, wherein the atoms in the group V element of the Periodic Table are atoms of an element selected from the group consisting of N, P, As, Sb, and Bi.

5. A process according to claim 1, wherein the light energy utilized is a member selected from the group consisting of ultraviolet rays, infrared rays, visible light rays, X-rays, and γ- rays.

6. A process according to claim 1, wherein the silicon compound is a member selected from the group consisting of:

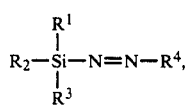  (a)

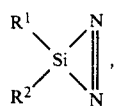  (b)

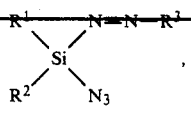  (c)

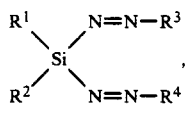  (d)

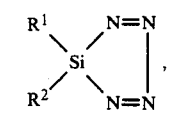  (e)

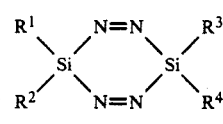  (f)

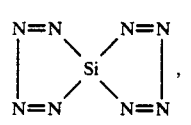  (g)

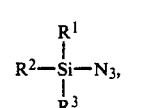  (h)

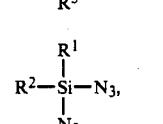  (i)

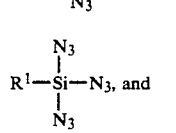  (j)

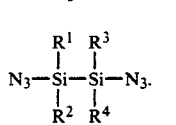  (k)

wherein $R^1$, $R^2$, $R^3$, and $R^4$ are independently a hydrogen atom, a halogen, an aryl group, an alkyl group or an alkoxyl group having 1 to 4 carbons and can be the same or difference (all of $R^1$ to $R^4$ can be methyl groups), the aryl group, the alkyl group or the alkoxyl group being replaceable with another substituting group, and $R^1$ to $R^4$ being preferably a hydrogen atoms, an alkyl group having 1 to 4 carbons, F, Cl or Br.

7. A process according to claim 1, wherein the silicon compound is a compound having at least one azo group directly bonded to a silicon atom.

8. A process according to claim 1, wherein the silicon compound is a compound having at least one azide group directly bonded to a silicon atom.

* * * * *